United States Patent
Shim

(10) Patent No.: US 10,326,467 B1
(45) Date of Patent: Jun. 18, 2019

(54) ANALOG-TO-DIGITAL CONVERTER

(71) Applicant: DB HiTek Co., Ltd, Seoul (KR)

(72) Inventor: Hee Sung Shim, Seoul (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/216,488

(22) Filed: Dec. 11, 2018

(51) Int. Cl.
*H03M 1/12* (2006.01)
*H03M 1/46* (2006.01)
*H03M 1/44* (2006.01)

(52) U.S. Cl.
CPC .............. *H03M 1/466* (2013.01); *H03M 1/12* (2013.01); *H03M 1/442* (2013.01); *H03M 1/46* (2013.01)

(58) Field of Classification Search
CPC ........ H03M 1/466; H03M 1/46; H03M 1/442; H03M 1/12
USPC ........................................................ 341/155
See application file for complete search history.

(56) References Cited

U.S. PATENT DOCUMENTS

| | | | |
|---|---|---|---|
| 8,686,888 B2 * | 4/2014 | Chou | H03F 3/005 341/155 |
| 9,214,949 B1 * | 12/2015 | Wu | H02M 3/07 |
| 9,413,377 B1 * | 8/2016 | Chang | H03H 19/006 |
| 9,503,121 B2 * | 11/2016 | Bach | H03M 3/464 |

* cited by examiner

*Primary Examiner* — Brian K Young
(74) *Attorney, Agent, or Firm* — Andrew D. Fortney; Central California IP Group, P.C.

(57) ABSTRACT

An analog-to-digital converter includes an analog-to-digital conversion unit configured to output first and second digital signals based on a comparison of first and second reference voltages with an input signal, an amplifier including first and second input terminals and an output terminal, a first capacitor having one end or electrode connected to the first input terminal of the amplifier, a second capacitor having one end or electrode connected to the first input terminal of the amplifier, a third capacitor having one end or electrode connected to the first input terminal of the amplifier, a switch unit configured to selectively provide a third or fourth reference voltage to at least one of the second and third capacitors based on the first and second digital signals, and a control switch between another end or electrode of the first capacitor and the output terminal of the amplifier.

20 Claims, 5 Drawing Sheets

FIG. 2A

| S1=ON, S2=OFF, S21=OFF → SAMPLING OPERATION STATE |
|---|
| sw0=0, sw1=0, sw2=0, sw3=0 |

FIG. 2B

| S1=OFF, S2=ON → AMPLIFICATION OPERATION STATE (Vef4>Vef2>Vef1>Vef3) ||
|---|---|
| D0=0, D1=0 | sw0=1, sw1=0, sw2=1, sw3=0 → Vout = 2VIN - Vref3 |
| D0=1, D1=0 | sw0=0, sw1=1, sw2=1, sw3=0<br>or<br>sw0=1, sw1=0, sw2=0, sw3=1 → Vout = 2VIN - (Vref3+Vref4)/2 |
| D0=1, D1=1 | sw0=0, sw1=1, sw2=0, sw3=1 → Vout = 2VIN - Vref4 |

ANALOG-TO-DIGITAL CONVERTER

This application claims the benefit of Korean Patent Application No. 10-2017-0169946, filed on Dec. 12, 2017, which is hereby incorporated by reference as if fully set forth herein.

BACKGROUND OF THE INVENTION

Field of the Invention

Embodiments of the present invention relate to an analog-to-digital converter.

Discussion of the Related Art

An analog-to-digital converter (ADC) is a device for converting an input analog signal into a digital signal, which is essential for most electronic devices such as inter-vehicle communication, wireless communication and biosensors.

A multi-bit ADC has a front-end sample-and-hold amplifier (SHA) and rear-end ADC stages (hereinafter referred to as "modules") for performing data conversion using a signal held in the SHA.

Among analog-to-digital converters, a pipelined ADC or a multi-step ADC, such as a two-step ADC, can use a multiplying digital-to-analog converter (MDAC) as an internal functional block.

SUMMARY OF THE INVENTION

Accordingly, embodiments of the present invention are directed to an analog-to-digital converter that substantially obviates one or more problems due to limitations and disadvantages of the related art.

An object of certain embodiments is to provide an analog-to-digital converter (ADC) capable of improving linearity and preventing malfunction during analog-to-digital conversion due to mismatch between resistors in a voltage source (e.g., a voltage generator).

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof, as well as the appended drawings.

To achieve these objects and other advantages and in accordance with the purpose(s) of the embodiments, as embodied and broadly described herein, the analog-to-digital converter includes (a) an analog-to-digital conversion unit configured to (i) receive an input signal (e.g., an analog input signal), (ii) output a first digital signal based on or in response to a comparison of a first reference voltage with the input signal, and (iii) output a second digital signal based on or in response to a comparison of a second reference voltage with the input signal, (b) an amplifier including a first input terminal, a second input terminal and an output terminal, (c) a first capacitor having one end or electrode connected to the first input terminal, (d) a second capacitor having one end or electrode connected to the first input terminal, (e) a third capacitor having one end or electrode connected to the first input terminal, (f) a switch unit configured to selectively provide a third reference voltage or a fourth reference voltage to another end or electrode of at least one of the second capacitor and the third capacitor based on or in response to the first digital signal and the second digital signal, and (g) a control switch between another end or electrode of the first capacitor and the output terminal.

The second reference voltage may be greater than the first reference voltage, the third reference voltage may be less than the first reference voltage, and the fourth reference voltage may be greater than the second reference voltage.

Capacitance values of the second capacitor and the third capacitor may be half of a capacitance value of the first capacitor.

The analog-to-digital converter may further include a logic circuit configured to generate first to fourth switch control signals that control the switch unit based on or in response to the first and second digital signals.

The switch unit may include (i) a first switch between the third reference voltage and another end or electrode of the third capacitor, the first switch controlled by the first switch control signal, (ii) a second switch between the fourth reference voltage and another end or electrode of the third capacitor, the second switch controlled by the second switch control signal, (iii) a third switch between the third reference voltage and another end or electrode of the second capacitor, the third switch controlled by the third switch control signal, and (iv) a fourth switch between the fourth reference voltage and another end or electrode of the second capacitor, the fourth switch controlled by the fourth switch control signal.

The analog-to-digital converter may further include (i) a first sampling switch between the other end or electrode of the first capacitor and an input terminal (e.g., of the analog-to-digital converter) configured to receive the input signal, (ii) a second sampling switch between the other end or electrode of the second capacitor and the input terminal (e.g., of the analog-to-digital converter), (iii) a third sampling switch between the other end or electrode of the third capacitor and the input terminal (e.g., of the analog-to-digital converter); and (iv) a fourth sampling switch between the output terminal of the amplifier and the first input terminal of the amplifier. The first to third sampling switches may be controlled by a first control signal (e.g., a first sampling switch control signal).

The analog-to-digital conversion unit may include (i) a first comparator having a first input terminal, a second input terminal, and an output terminal configured to output the first digital signal, (ii) a second comparator including a first input terminal, a second input terminal, and an output terminal configured to output the second digital signal, (iii) a first sampling capacitor having one end or electrode connected to the first input terminal of the first comparator, (iv) a second sampling capacitor having one end or electrode connected to the first input terminal of the second comparator, (v) a fifth sampling switch between the input terminal and another end or electrode of the first sampling capacitor, the fifth sampling switch being controlled by a first control signal (e.g., a first sampling switch control signal), (vi) a sixth sampling switch between the input terminal and another end or electrode of the second sampling capacitor, the sixth sampling switch being controlled by the first control signal (e.g., the first sampling switch control signal), (vii) a first (or fifth) switch between the first reference voltage and another end or electrode of the first sampling capacitor, the first or fifth switch being controlled by a second control signal (e.g., a second sampling switch control signal), and (viii) a second or sixth switch between the second reference voltage and another end or electrode of the second sampling capacitor, the second or sixth switch being controlled by the second control signal (e.g., the second sampling switch control signal).

The control switch may be controlled by the second control signal (e.g., the second sampling switch control signal).

A common (e.g., the same) voltage may be provided to the second input terminal of the amplifier, the second input terminal of the first comparator, and the second input terminal of the second comparator.

The switch unit may provide the third reference voltage to the other end or electrode of the second capacitor and the other end or electrode of the third capacitor when a voltage of the input signal is less than the first reference voltage and the second reference voltage (e.g., less than the first reference voltage).

The switch unit may provide the third reference voltage to the other end or electrode of the second capacitor and the fourth reference voltage to the other end or electrode of the third capacitor when a voltage of the input signal is greater than the first reference voltage and less than the second reference voltage.

The switch unit may provide the fourth reference voltage to the other end or electrode of the second capacitor and the other end or electrode of the third capacitor when a voltage of the input signal is greater than the first reference voltage and the second reference voltage (e.g., greater than the second reference voltage).

When a voltage of the input signal is less than the first reference voltage and the second reference voltage, each of the first and second digital signals may have a low level (e.g., a low voltage or logic level), the first switch and the third switch may be turned on, and the second switch and the fourth switch may be turned off.

When a voltage of the input signal is greater than the first reference voltage and is less than the second reference voltage, the first digital signal may have a high level (e.g., a high voltage or logic level), the second digital signal may have a low level, the second switch and the third switch may be turned on, and the first switch and the fourth switch may be turned off.

When a voltage of the input signal is greater than the first reference voltage and the second reference voltage, each of the first and second digital signals may have a high level, the second switch and the fourth switch may be turned on, and the first switch and the third switch may be turned off.

According to one or more other aspects, the analog-to-digital converter may include (a) an input terminal configured to receive an input signal, (b) an analog-to-digital conversion unit configured to output a digital code based on or in response to a comparison of a first reference voltage with the input signal and a comparison of a second reference voltage with the input signal, (c) a logic circuit configured to generate a first switch control signal, a second switch control signal, a third switch control signal and a fourth switch control signal based on or in response to the digital code, and (d) a multiplying digital-to-analog converter (MDAC) including an amplifier including a first input terminal, a second input terminal and an output terminal, a first capacitor, a second capacitor, a third capacitor, a switch unit and a control switch. One end or electrode of each of the first to third capacitors is connected to the first input terminal of the amplifier. The switch unit includes (i) a first switch between the third reference voltage and another end or electrode of the third capacitor, the first switch being controlled by the first switch control signal, (ii) a second switch between the fourth reference voltage and the other end or electrode of the third capacitor, the second switch controlled by the second switch control signal, (iii) a third switch between the third reference voltage and another end or electrode of the second capacitor, the third switch being controlled by the third switch control signal, and (iv) a fourth switch between the fourth reference voltage and the other end or electrode of the second capacitor, the fourth switch being controlled by the fourth switch control signal. The control switch is between another end or electrode of the first capacitor and the output terminal of the amplifier.

The first reference voltage may be greater than the third reference voltage, the second reference voltage may be greater than the first reference voltage, and the fourth reference voltage may be greater than the second reference voltage, and capacitance values of the second capacitor and the third capacitor may be half a capacitance value of the first capacitor.

The analog-to-digital converter may further include a first sampling switch between the other end or electrode of the first capacitor and the input terminal (e.g., of the analog-to-digital converter) configured to receive the input signal, a second sampling switch between the other end or electrode of the second capacitor and the input terminal (e.g., of the analog-to-digital converter), a third sampling switch between the other end or electrode of the third capacitor and the input terminal, and a fourth sampling switch between the output terminal of the amplifier and the first input terminal of the amplifier. When a first control signal (e.g., a first sampling switch control signal) turns on the first to third sampling switches, a second control signal (e.g., a second sampling switch control signal) may turn off the control switch.

When the first control signal (e.g., the first sampling switch control signal) turns on the first to third sampling switches, the second control signal (e.g., the second sampling switch control signal) may turn off the control switch.

According to one or more other aspects, an analog-to-digital converter having a multistage structure may include a plurality of analog-to-digital conversion blocks. Each of the plurality of analog-to-digital conversion blocks is or comprises the present analog-to-digital converter, and except for one of the analog-digital converter blocks, an output voltage of the amplifier of each the analog-to-digital conversion block is input to a next stage (e.g., a next analog-to-digital conversion block).

It is to be understood that both the foregoing general description and the following detailed description of various embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings:

FIG. 2A is a diagram showing switch control signals from a logic circuit during a sampling operation of an exemplary analog-to-digital converter according to one or more embodiments of the invention;

FIG. 2B is a diagram showing switch control signals from the logic circuit and output voltages of a multiplying digital-to-analog converter (MDAC) during an amplification operation of an exemplary analog-to-digital converter according to one or more embodiments of the invention;

DETAILED DESCRIPTION OF THE INVENTION

Figure 1:
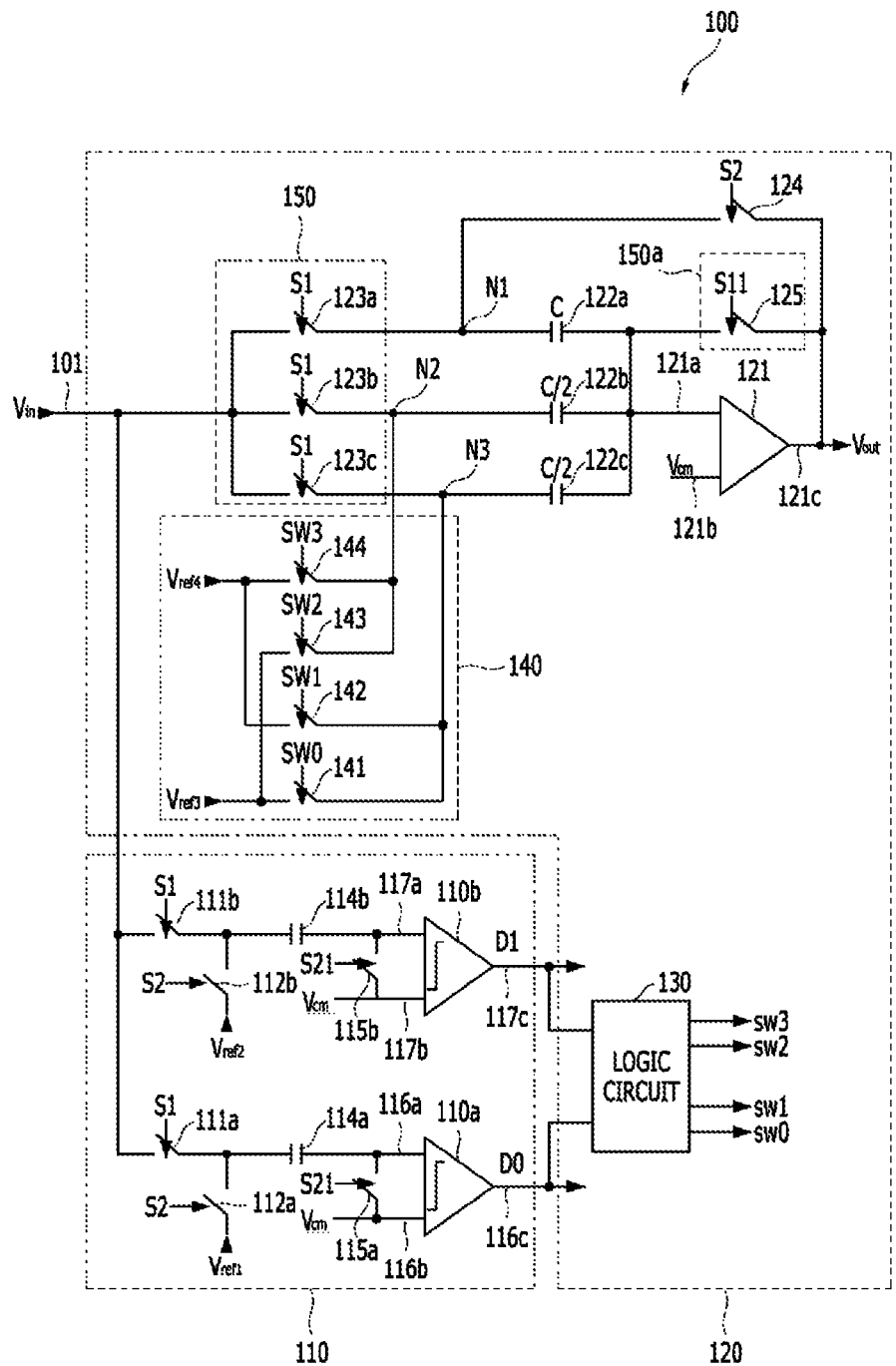
FIG. 1 is a diagram showing the configuration of an exemplary 1.5-bit analog-to-digital converter (ADC) according to one or more embodiments of the present invention.

Reference will now be made in detail to embodiments of the present invention, examples of which are illustrated in the accompanying drawings.

In the following description of various embodiments, it will be understood that, when an element is referred to as being "on" or "under" another element, it can be directly on or under another element or can be indirectly on or under the other element with one or more intervening elements therebetween. Furthermore, when the expression "on" or "under" is used herein, it may include the upward direction and the downward direction with reference to another element.

In addition, it will be understood that relative terms used hereinafter such as "first" and "second," "on"/"above"/ "over," and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

The terms "including", "comprising", "having" and variations thereof disclosed herein mean "including at least the following" unless expressly specified otherwise, and, as such, should not be construed to exclude elements other than the elements disclosed herein. In addition, the terms "corresponding" and variations thereof disclosed herein may involve at least one of the meanings of "facing," "overlapping" and "in a unique or 1:1 relationship with."

Figure 3A:
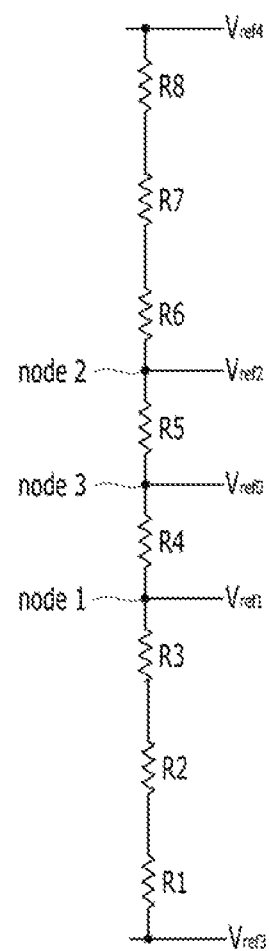
FIG. 3A is a diagram showing a voltage generator configured to provide reference voltages to a conventional analog-to-digital converter.
Figure 3B:
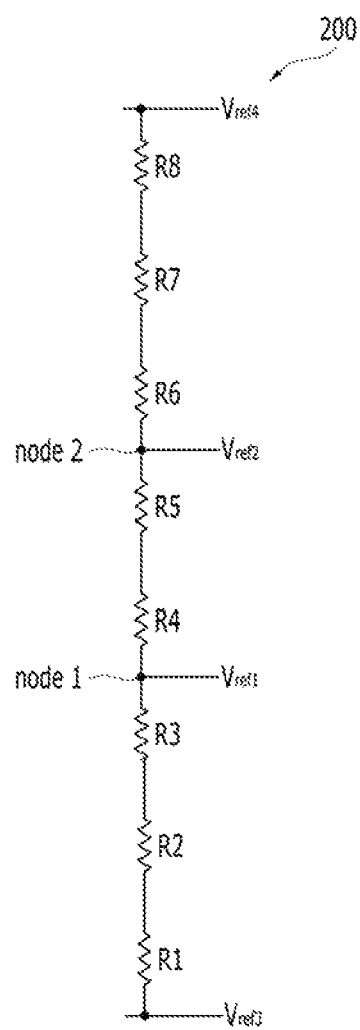
FIG. 3B is an exemplary voltage generator configured to provide reference voltages to the present analog-to-digital converter in accordance with one or more embodiments of the present invention.

FIG. 1 is a diagram showing the configuration of an exemplary 1.5-bit analog-to-digital converter 100 according to one or more embodiments of the present invention, and FIG. 3B shows an exemplary embodiment of a voltage generator 200 configured to generate reference voltages Vref1 to Vref4 provided to the analog-to-digital converter 100 according to various embodiments.

Referring to FIG. 1, the ADC 100 includes an analog-to-digital conversion unit 110 and a multiplying digital-to-analog converter (MDAC) 120.

The analog-to-digital conversion unit 110 receives an input signal Vin as an analog signal through an input terminal 101 and converts the received input signal Vin into digital signals D0 and D1.

The MDAC 120 samples and stores the input signal Vin, amplifies the stored input signal Vin, and outputs the amplified voltage Vout. The amplified voltage Vout may be sent to an analog-to-digital converter of a successive or next stage of the analog-to-digital converter.

The analog-to-digital conversion unit 110 may output the digital codes D0 and D1 based on or in response to comparisons of a first reference voltage Vref1 with the input signal Vin and of a second reference voltage Vref2 with the input signal Vin.

For example, the analog-to-digital conversion unit 110 samples the input signal Vin and outputs a first digital value D0 (e.g., a first digital signal) according to the comparison of the sampled input signal Vin with the first reference voltage Vref1.

In addition, for example, the analog-to-digital conversion unit 110 generates a second digital value D1 (e.g., a second digital signal) according to the comparison of the sampled input signal Vin with the second reference voltage Vref2.

For example, the analog-to-digital conversion unit 110 may include a first comparator 110a, a second comparator 110b, a first sampling capacitor 114a, a second sampling capacitor 114b, and switches 111a, 111b, 112a and 112b.

The first comparator 110a may include a first input terminal 116a, a second input terminal 116b and an output terminal 116c configured to output the first digital signal D0, and the second comparator 110b may include a first input terminal 117a, a second input terminal 117b and an output terminal 117c configured to output the second digital signal D1.

One end or electrode of the first sampling capacitor 114b may be connected to the first input terminal 116a of the first comparator 110a, and one end or electrode of the second sampling capacitor 114a may be connected to the first input terminal 117a of the second comparator 110b.

The sampling switch 111a may be between the input terminal 101 and another (e.g., a second or complementary) end or electrode of the first sampling capacitor 114a, and the sampling switch 111a may be controlled (e.g., turned on or off) by a first control signal S1.

A common (i.e., same) voltage Vcm may be provided to the second input terminal 116b of the first comparator 110a, and the first digital signal D0 may be output from the output terminal 116c of the first comparator 110a.

The switch 112a may connect the first reference voltage Vref1 to another end or electrode of the first sampling capacitor 114a, and the switch 112a may be controlled by a second control signal S2.

The sampling switch 111b may be between the input terminal 101 and another end or electrode of the second sampling capacitor 114b and the sampling switch 111b may be controlled by the first control signal S1.

The common (i.e., same) voltage Vcm may be provided to the second input terminal 117b of the second comparator 110b, and the second digital signal D1 may be output from the output terminal 117c of the second comparator 110b.

The switch 112b may connect the second reference voltage Vref2 to the other end or electrode of the second sampling capacitor 114b, and the switch 112b may be controlled by the second control signal S2.

The MDAC 120 may generate switch control signals sw0 to sw4 based on or in response to the first and second digital signals D0 and D1 received from the analog-to-digital conversion unit 110. The digital codes may be or comprise the first and second digital values D0 and D1.

The MDAC 120 may include a logic circuit 130, a first capacitor 122a, a second capacitor 122b, a third capacitor 122c, an amplifier 121, a switch unit 140, and a control switch 124.

The MDAC 120 may further include a sampling switch unit 150 configured to sample the input signal Vin (e.g., connect the input signal Vin to the first to third capacitors 122a-c.

The sampling switch unit 150 may sample the input signal Vin based on or response to control signals S1 and S11, and store the sampled signal in the first capacitor 122a, the second capacitor 122b and the third capacitor 122c.

The amplifier 121 may include a first input terminal 121a, a second input terminal 121b, and an output terminal 121c.

One end or electrode of the first capacitor 122a may be connected to the first input terminal 121a of the amplifier 121, one end or electrode of the second capacitor 122b may be connected to the first input terminal 121a of the amplifier 121, and one end or electrode of the third capacitor 122c may be connected to the first input terminal 121a of the amplifier 121.

The common voltage Vcm may be provided to the second input terminal 121b of the amplifier 121.

The common voltage Vcm may be input for an amplification operation of the amplifier 121.

The control switch 124 may be between another (e.g., a second or complementary) end or electrode of the first capacitor 122a and the output terminal 121c of the amplifier 121. The control switch 124 may be controlled by the second control signal S2.

The control switch 124 may be between a first node N1 (at which the first switch 123a and another end or electrode of first capacitor 122a are connected to each other) and the output terminal 121c of the amplifier 121. The control switch 124 may be turned on or off by the second control signal S2.

The capacitance value C/2 of each of the second capacitor 122b and the third capacitor 122c may be half the capacitance value C of the first capacitor 122a.

When D0=1 and D1=0 in FIG. 2B, by correlation among the capacitance values of the first to third capacitors, an equation of the output voltage Vout of the MDAC 120 of FIG. 1 may be derived. That is, the correlation among the capacitance values of the first to third capacitors may be related to (Vref3+Vref4)/2 in the equation of the output voltage Vout of the MDAC 120 of FIG. 1.

Referring back to FIG. 1, the sampling switch unit 150 may include a sampling switch 123a between the input terminal 101 and the other end or electrode of the first capacitor 122a, a sampling switch 123b between the input terminal 101 and the other end or electrode of the second capacitor 122b, and a sampling switch 123c between the input terminal 101 and the other end or electrode of the third capacitor 122c. The sampling switch unit 150 may further include a sampling switch 125 (subunit 150a) between the output terminal 121c and the first input terminal 121a of the amplifier 121.

Each of the sampling switches 123a, 123b and 123c may be controlled (e.g., turned on or off) by the first control signal S1, and the sampling switch 125 may be controlled (e.g., turned on or off) by the control signal S11.

The logic circuit 130 may generate the switch control signals SW0 to SW3 based on or response to the digital signals or codes D0 and D1 received from the analog-to-digital conversion unit 110.

The switch unit 140 selectively provides a third reference voltage Vref3 or a fourth reference voltage Vref4 to the other end or electrode of the second capacitor 122b and/or the other end or electrode of the third capacitor 122c based on or response to the first digital signal D0 and the second digital signal D1.

The switch unit 140 may provide one or both of the third reference voltage Vref3 and the fourth reference voltage Vref4 to one or both of the other ends or electrodes of the second capacitor 122b and the third capacitor 122c based on or response to the switch control signals SW0 to SW3 provided from the logic circuit 130. For example, the third reference voltage Vref3 or the forth reference voltage Vref4 may be provided to both of the second and third capacitors, or the third reference voltage Vref3 may be provided to one of the second and third capacitors 122b-c and the fourth reference voltage Vref4 to the other one of the second and third capacitors 122b-c.

The second node N2 may be a node at which the sampling switch 123b and the second capacitor 122b are connected to each other, and the third node N3 may be a node at which the sampling switch 123c and one end or electrode of the third capacitor 122c are connected to each other.

The switch unit 140 may include a plurality of switches 141, 142, 143 and 144.

The switch 141 may be receive the third reference voltage Vref3 and selectively provide the third reference voltage Vref3 to the other end or electrode of the third capacitor 122c (e.g., at the third node N3), and the switch 141 may be controlled (e.g., turned on or off) by the first switch control signal SW0.

The switch 142 may be between the fourth reference voltage Vref4 and the other end or electrode of the third capacitor 122c (or the third node N3), and the switch 142 may be controlled (e.g., turned on or off) by the second switch control signal SW1.

The switch 143 may be between the third reference voltage Vref3 and the other end or electrode of the second capacitor 122b (e.g., the second node N2), and the switch 143 may be controlled (e.g., turned on or off) by the third switch control signal SW2.

The switch 144 may be between the fourth reference voltage Vref4 and the other end or electrode of the second capacitor 122b (or the second node N2), and the switch 144 may be controlled (e.g., turned on or off) by the fourth switch control signal SW3.

The first to fourth reference voltages Vref1 to Vref4 may be provided by the voltage generator 200, shown in FIG. 2B. The voltage generator 200 may be implemented by a plurality of resistors R1 to R8 connected in series (e.g., an "R-string"). First and second supply or reference voltages may be provided to respective ends of the R-string. Although an R-string including eight resistors connected in series is shown in FIG. 3B, the number of resistors is not limited thereto. For example, a voltage of 1V may be supplied to one end or terminal of R1 and a voltage of 2V may be supplied to one end or terminal of R8, without being limited thereto. The voltage of 1V may also be the third reference voltage Vref3, and the voltage of 2V may also be the fourth reference voltage Vref4.

The second reference voltage Vref2 is greater than the first reference voltage Vref1, the third reference voltage Vref3 is less than the first reference voltage Vref1, and the fourth reference voltage Vref4 is greater than the second reference voltage Vref2 (Vref4>Vref2>Vref1>Vref3).

FIG. 2A shows the switch control signals sw0 to sw3 of the logic circuit 130 during the sampling operation of the analog-to-digital converter 100 of FIG. 1.

Referring to FIG. 2A, in the sampling operation, the switches 111a, 111b, 123a, 123b and 123c in FIG. 1 controlled by the first control signal S1 are turned on, and the switches 112a and 112b in FIG. 1 are controlled by the second control signal S2 are turned off. In addition, the switches 115a and 115b controlled by the third control signal S21 are turned off.

Figure 4:
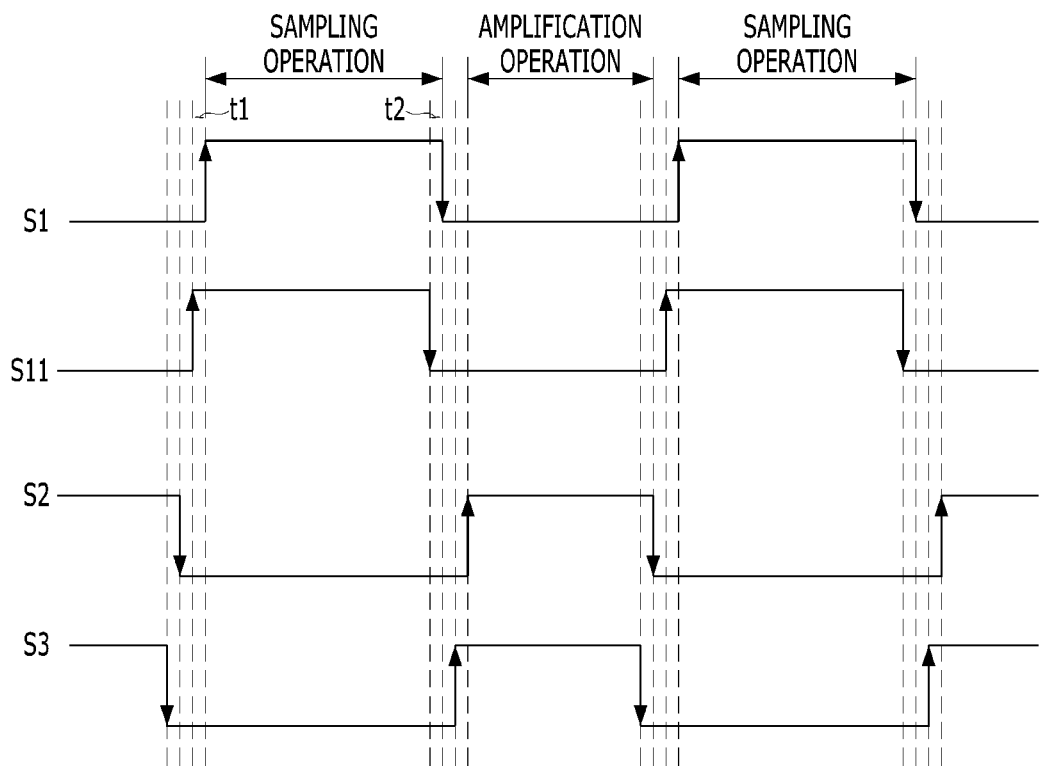
FIG. 4 is a timing chart of control signals shown in FIG. 1.

For example, the sampling operation may be performed according to the timing chart shown in FIG. 4.

In the sampling operation, the input signal Vin may be sampled by and stored in the first and second sampling capacitors 114a and 114b in FIG. 1.

In the sampling operation, the input signal Vin may be stored in the first to third capacitors 122a, 122b and 122c of FIG. 1.

In addition, in the sampling operation, all the switches 141 to 144 of FIG. 1 of the switch unit 140 in FIG. 1 controlled by the switch control signals SW0 to SW3 may be turned off.

In addition, the switches 141, 142, 143 and 144 in FIG. 1 may be turned off when the values of the switch control signals SW0, SW1, SW2 and SW3 have a low logic level (e.g., a binary logic 0) and the switches 141, 142, 143 and 144 in FIG. 1 may be turned on when the values of the switch control signals SW0, SW1, SW2 and SW3 have a high logic level (e.g., a binary logic 1) or vice versa, without being limited thereto.

FIG. 2B shows the switch control signals sw0 to sw3 from the logic circuit 130 in FIG. 1 and the output voltage Vout of the MDAC 120 in FIG. 1 during the amplification operation of the analog-to-digital converter 100 of FIG. 1.

Referring to FIG. 2B, in the amplification operation, the switches 111a, 111b, 123a, 123b and 123c in FIG. 1 controlled by the first control signal S1 are turned off, and the switches 112a and 112b in FIG. 1 controlled by the second control signal S2 are turned on.

For example, the amplification operation may be performed according to the timing chart shown in FIG. 4.

In the amplification operation, the first comparator 110a in FIG. 1 may output the first digital signal D0 based on or response to the comparison of the voltage of the input signal Vin in the first capacitor 114a in FIG. 1 with the first reference voltage Vref1.

In the amplification operation, the second comparator 110b in FIG. 1 may output the second digital signal D1 based on or response to the comparison of the voltage VIN of the input signal Vin stored in the second capacitor 114b in FIG. 1 with the second reference voltage Vref2.

That is, when the voltage VIN of the input signal Vin is less than the first reference voltage Vref1, D0 and D1 may each have a low logic level (e.g., 0), the first switch 141 and the third switch 143 in FIG. 1 may be turned on, and the second switch 142 and the fourth switch 144 in FIG. 1 may be turned off.

In addition, when the voltage VIN of the input signal Vin is greater than the second reference voltage Vref2, D0 and D1 may each have a high logic level (e.g., 1), the second switch 142 and the fourth switch 144 in FIG. 1 may be turned on, and the first switch 141 and the third switch 143 in FIG. 1 may be turned off.

In addition, when the voltage VIN of the input signal Vin is greater than the first reference voltage Vref1 and less than the second reference voltage Vref2, D0 may have a high logic level (e.g., 1), D1 may have a low logic level (e.g., 0), the second switch 142 and the third switch 143 in FIG. 1 may be turned on, and the first switch 141 and the fourth switch 144 in FIG. 1 may be turned off.

For example, the switch unit 140 in FIG. 1 may provide the third reference voltage Vref3 to each of the other end or electrode of the second capacitor 122b (or the second node N2) and the third capacitor 122c (or the third node N3) when the voltage VIN of the input signal Vin is less than the first reference voltage Vref1 and the second reference voltage Vref2.

In addition, for example, the switch unit 140 in FIG. 1 may provide the third reference voltage Vref3 to the other end or electrode of the second capacitor 122b in FIG. 1 and provide the fourth reference voltage Vref4 to the other end or electrode of the third capacitor 122c in FIG. 1, when the voltage of the input signal Vin is greater than the first reference voltage Vref1 and is less than the second reference voltage Vref2.

In addition, for example, the switch unit 140 in FIG. 1 may provide the fourth reference voltage Vref4 to the other end or electrode of the second capacitor 122b in FIG. 1 and provide the third reference voltage Vref3 to the other end or electrode of the third capacitor 122c in FIG. 1, when the voltage VIN of the input signal Vin is greater than the first reference voltage Vref1 and the second reference voltage Vref2. Thus, the logic circuit 130 in FIG. 1 may be configured to output values of the control signals sw0 to sw3 so that the switch unit 140 provides at least one of the third and fourth reference voltages Vref3 and Vref4 to each of the second and third capacitors 122b-c.

In addition, the analog-to-digital converter 100 of FIG. 1 may further include (i) a switch 115a between the first input terminal 116a and the second input terminal 116b of the first comparator 110a, controlled by a third control signal S21, and (ii) a switch 115b between the first input terminal 117a and the second input terminal 117b of the second comparator 110b, controlled by the third control signal S21.

In response to the third control signal S21, the switches 115a and 115b may be simultaneously turned on or off. The switches 115a and 115b may be turned off during the sampling operation and the amplification operation. Turning on the switches 115a-b may function as a reset operation in the analog-digital converter unit 110.

FIG. 4 is a timing chart of an embodiment of the control signals S1, S11, S2 and S21 in FIG. 1. In FIG. 4, the switches 123a to 123c, 111a, 111b, 125, 112a, 112b, 124, 115a and 115b in FIG. 1 are turned off when the control signals S1, S11, S2 and S21 have a first logic level (e.g., a low logic level) and are turned on when the control signals S1, S11, S2 and S21 have a second logic level (e.g., a high logic level) or vice versa, without being limited thereto.

Referring to FIG. 4, the sampling switches 123a to 123c and the switches 111a and 111b in FIG. 1 may be turned on a predetermined first time t1 after the sampling switch 125 is turned on, and may be turned off a predetermined second time t2 after the sampling switch 125 is turned off.

The sampling operation and the amplification operation may be alternately performed.

For example, the sampling switch 125 may be turned on before the sampling operation starts and may be turned off before the sampling operation ends.

For example, the first time t1 and the second time t2 may be the same, without being limited thereto.

The third control signal S21 may be changed or shifted to the second logic level between the end of the sampling operation and the start of the amplification operation, and may be changed or shifted to the first logic level before the end of the amplification operation.

In the period during which the second control signal S2 has a first logic level, the switch control signals sw0 to sw4 may have a first logic level, and the switches 141 to 144 may all be turned off.

For example, as shown in FIG. 2A, during the sampling operation period, the switch control signals sw0 to sw4 may have a first logic level and the switches 141 to 144 may all be turned off.

In the amplification operation period (during which the second control signal S2 has a second logic level), as shown in FIG. 2B, the switch control signals sw0 to sw3 may be generated based on or response to the digital signals D0 and D1 output from the analog-to-digital conversion unit 110 in FIG. 1, and the switches 141 to 144 may be controlled by the switch control signals sw0 to sw3.

FIG. 3A shows a voltage generator configured to providing reference voltages to a conventional analog-to-digital converter, and FIG. 3B shows an exemplary voltage generator 200 configured to provide reference voltages to an analog-to-digital converter according to one or more embodiments of the present invention.

The voltage generator of FIG. 3A may be implemented by an R-string including a plurality of resistors R1 to R8 connected in series and having output nodes node1, node2 and node3.

The plurality of resistors R1 to R8 may be connected between the third reference voltage Vref3 and the fourth reference voltage Vref4 in series. The first reference voltage Vref1 may be output from the connection node node1 between the third resistor R3 and the fourth resistor R4, the second reference voltage Vref2 may be output from the connection node node2 between the fifth resistor R5 and the sixth resistor R6, and the reference voltage Vref0 (Vref3<Vref0<Vref4) may be output from the connection node node3 between the fourth resistor R4 and the fifth resistor R5.

The amplification unit included in the MDAC of the conventional analog-to-digital converter may include two capacitors connected to the first input terminal in parallel and a switching unit. The switching unit may selectively provide three reference voltages Vref3, Vref0 and Vref4 from the voltage generator shown in FIG. 3A to any one of the two capacitors.

However, a mismatch between resistance values of the plurality of resistors in the voltage generator of FIG. 3A may occur during the manufacturing process, and thus, the reference voltage Vref0 may deviate from an average of the third reference voltage Vref3 and the fourth reference voltage Vref4. The linearity of the analog-to-digital converter may thus deteriorate, which may cause the analog-to-digital converter to malfunction.

The generator 200 of FIG. 3B may be implemented by an R-string including a plurality of resistors R1 to R8, including output nodes node1 and node2. The output node node3 in the R-string of FIG. 3A may not be present in the voltage generator 200 of FIG. 3B and/or may not provide the reference voltage Vref0 in FIG. 3A.

The analog-to-digital converter 100 according to various embodiments may generate a reference voltage having a voltage value between the first reference voltage Vref1 and the second reference voltage Vref2 through capacitor dividing using the switch unit 140 and the first to third capacitors 122a, 122b and 122c included in the MDAC 120, without generating a fifth reference voltage (e.g., a voltage corresponding to Vref0 in FIG. 3a) between the third reference voltage Vref3 and the fourth reference voltage Vref4 through voltage dividing in the R-string.

Since the matching characteristics of capacitors are superior to the matching characteristics of resistors, various embodiments of the present invention may improve linearity of the analog-to-digital converter and prevent malfunction of the analog-to-digital converter due to mismatch between resistors in the voltage generator.

Figure 5:
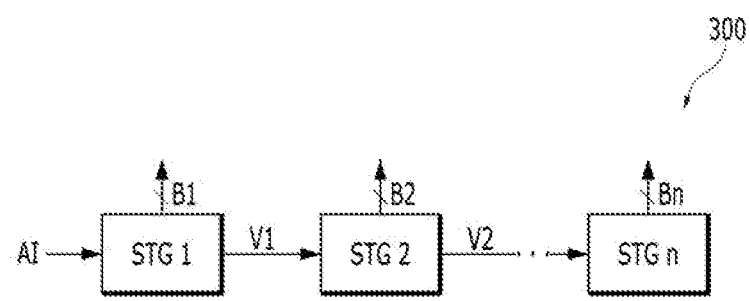
FIG. 5 is a diagram showing the configuration of an exemplary ADC having a multistage structure according to embodiments of the present invention.

FIG. 5 is a diagram showing the configuration of an exemplary analog-to-digital converter (ADC) 300 having a multistage structure according to various embodiments of the present invention.

Referring to FIG. 5, the ADC 300 having the multistage structure may include n (n being a natural number greater than 1) stages of ADC blocks STG1 to STGn (n being a natural number greater than 1), receive an analog signal AI and output digital signals B1 to Bn by converting the received analog signal AI. Each of the ADC blocks STG1 to STGn (n being a natural number greater than 1) may comprise or be implemented by the analog-to-digital converter 100 as shown in and/or described with respect to FIG. 1. Except for the last stage or block STGn, the output voltage V1, V2 . . . Vn−1 from the amplifier in each successive ADC block or stage may be input to the next stage.

For example, the ADC 300 having the multistage structure may be a pipelined ADC, a two-step ADC, or a cyclic ADC, without being limited thereto.

According to various embodiments, it is possible to improve linearity and to prevent malfunction during analog-to-digital conversion due to mismatch between resistors in a voltage generator.

Features, structures, effects, and the like as described above in various embodiments of the present invention may be included in one or more embodiments of the present invention and should not be limited to only one embodiment. In addition, the features, structures, effects, and the like described in various embodiments may be combined or modified even with respect to one or more embodiments of the present invention by those skilled in the art. Accordingly, contents related to these combinations and modifications should be construed as within the scope of the present invention.

What is claimed is:

1. An analog-to-digital converter comprising:
an analog-to-digital conversion unit configured to (i) receive an input signal, (ii) output a first digital signal based on or in response to a comparison of a first reference voltage with the input signal, and (iii) output a second digital signal based on or in response to a comparison of a second reference voltage with the input signal;
an amplifier including a first input terminal, a second input terminal and an output terminal;
a first capacitor having one end or electrode connected to the first input terminal of the amplifier;
a second capacitor having one end or electrode connected to the first input terminal of the amplifier;
a third capacitor having one end or electrode connected to the first input terminal of the amplifier;
a switch unit configured to selectively provide a third reference voltage or a fourth reference voltage to another end or electrode of each of the second capacitor and another end or electrode of the third capacitor based on or in response to the first digital signal and the second digital signal; and
a control switch between another end of the first capacitor and the output terminal of the amplifier.

2. The analog-to-digital converter according to claim 1, wherein the second reference voltage is greater than the first reference voltage, the third reference voltage is less than the first reference voltage, and the fourth reference voltage is greater than the second reference voltage.

3. The analog-to-digital converter according to claim 2, wherein capacitance values of the second capacitor and the third capacitor are half of a capacitance value of the first capacitor.

4. The analog-to-digital converter according to claim 3, further comprising a logic circuit configured to generate first to fourth switch control signals configured to control the switch unit based on or in response to the first and second digital signals.

5. The analog-to-digital converter according to claim 4, wherein the switch unit includes:
   a first switch between the third reference voltage and the other end or electrode of the third capacitor, the first switch being controlled by a first switch control signal;
   a second switch between the fourth reference voltage and the other end or electrode of the third capacitor, the second switch being controlled by a second switch control signal;
   a third switch between the third reference voltage and the other end or electrode of the second capacitor, the third switch being controlled by a third switch control signal; and
   a fourth switch between the fourth reference voltage and the other end or electrode of the second capacitor, the fourth switch being controlled by a fourth switch control signal.

6. The analog-to-digital converter according to claim 1, further comprising:
   a first sampling switch between the other end or electrode of the first capacitor and an input terminal of the analog-to-digital converter;
   a second sampling switch between the other end or electrode of the second capacitor and the input terminal of the analog-digital converter;
   a third sampling switch between the other end or electrode of the third capacitor and the input terminal; and
   a fourth sampling switch between the output terminal of the amplifier and the first input terminal of the amplifier,
   wherein the first to third sampling switches are controlled by a first control signal.

7. The analog-to-digital converter according to claim 6, wherein the analog-to-digital conversion unit includes:
   a first comparator including a first input terminal, a second input terminal, and an output terminal configured to output the first digital signal;
   a second comparator including a first input terminal, a second input terminal, and an output terminal configured to output the second digital signal;
   a first sampling capacitor having one end or electrode connected to the first input terminal of the first comparator;
   a second sampling capacitor having one end or electrode connected to the first input terminal of the second comparator;
   a fifth sampling switch between the input terminal of the first comparator and another end or electrode of the first sampling capacitor and controlled by the first control signal;
   a sixth sampling switch between the input terminal of the second comparator and another end or electrode of the second sampling capacitor, controlled by the first control signal;
   a first switch between the first reference voltage and the other end or electrode of the first sampling capacitor, the first switch being controlled by the second control signal; and
   a second switch between the second reference voltage and the other end or electrode of the second sampling capacitor, the second switch being controlled by the second control signal.

8. The analog-to-digital converter according to claim 7, further comprising a control switch controlled by the second control signal.

9. The analog-to-digital converter according to claim 7, wherein the second input terminal of the amplifier, the second input terminal of the first comparator, and the second input terminal of the second comparator receive a common voltage.

10. The analog-to-digital converter according to claim 3, wherein the switch unit provides the third reference voltage to the other end or electrode of the second capacitor and the other end or electrode of the third capacitor when the input signal has a voltage that is less than the first reference voltage.

11. The analog-to-digital converter according to claim 3, wherein the switch unit provides the third reference voltage to the other end or electrode of the second capacitor and provides the fourth reference voltage to the other end or electrode of the third capacitor when the voltage of the input signal is greater than the first reference voltage and less than the second reference voltage.

12. The analog-to-digital converter according to claim 3, wherein the switch unit provides the fourth reference voltage to the other end or electrode of the second capacitor and the other end or electrode of the third capacitor when the voltage of the input signal is greater than the second reference voltage.

13. The analog-to-digital converter according to claim 5, wherein, when the input signal has a voltage that is less than the first reference voltage, each of the first and second digital signals has a low logic level, the first switch and the third switch are turned on, and the second switch and the fourth switch are turned off.

14. The analog-to-digital converter according to claim 5, wherein, when the voltage of the input signal is greater than the first reference voltage and less than the second reference voltage, the first digital signal has a high logic level, the second digital signal has a low logic level, the second switch and the third switch are turned on, and the first switch and the fourth switch are turned off.

15. The analog-to-digital converter according to claim 5, wherein, when the voltage of the input signal is greater than the second reference voltage, each of the first and second digital signals has a high logic level, the second switch and the fourth switch are turned on, and the first switch and the third switch are turned off.

16. An analog-to-digital converter comprising:
   an input terminal configured to receive an input signal;
   an analog-to-digital conversion unit configured to output a digital code based on or in response to a comparison of a first reference voltage with the input signal and a comparison of a second reference voltage with the input signal;
   a logic circuit configured to generate a first switch control signal, a second switch control signal, a third switch control signal and a fourth switch control signal based on or in response to the digital code; and
   a multiplying digital-to-analog converter (MDAC) including an amplifier including a first input terminal, a second input terminal and an output terminal, a first capacitor, a second capacitor, a third capacitor, a switch unit and a control switch,
   wherein one end or electrode of each of the first to third capacitors is connected to the first input terminal of the amplifier,
   the switch unit includes:

a first switch between the third reference voltage and the other end or electrode of the third capacitor, the first switch being controlled by the first switch control signal;

a second switch between the fourth reference voltage and another end or electrode of the third capacitor, the second switch being controlled by the second switch control signal;

a third switch between the third reference voltage and another end or electrode of the second capacitor, the third switch being controlled by the third switch control signal; and a fourth switch between the fourth reference voltage and the other end or electrode of the second capacitor, the fourth switch being controlled by the fourth switch control signal, and the control switch is between another end or electrode of the first capacitor and the output terminal of the amplifier.

17. The analog-to-digital converter according to claim 16, wherein the first reference voltage is greater than the third reference voltage, the second reference voltage is greater than the first reference voltage, and the fourth reference voltage is greater than the second reference voltage, and capacitance values of the second capacitor and the third capacitor are half of a capacitance value of the first capacitor.

18. The analog-to-digital converter according to claim 17, further comprising:

a first sampling switch between the other end or electrode of the first capacitor and the input terminal configured to receive the input signal;

a second sampling switch between the other end or electrode of the second capacitor and the input terminal;

a third sampling switch between the other end or electrode of the third capacitor and the input terminal; and a fourth sampling switch between the output terminal of the amplifier and the first input terminal of the amplifier, and wherein, when a first control signal turns on the first to third sampling switches, and a second control signal turns off the control switch.

19. The analog-to-digital converter according to claim 18, wherein, when the first control signal turns off the first to third sampling switches, the second control signal turns off the control switch.

20. An analog-to-digital converter having a multistage structure, comprising:

a plurality of analog-to-digital conversion blocks, wherein each of the plurality of analog-to-digital conversion blocks comprises the analog-to-digital converter according to claim 1, and an output voltage of the amplifier of each of the analog-to-digital conversion blocks except for a last one of the analog-digital conversion blocks is input to a next or successive one of the analog-digital conversion blocks.

* * * * *